(12) United States Patent
Bogart et al.

(10) Patent No.: US 10,802,524 B2
(45) Date of Patent: *Oct. 13, 2020

(54) ADJUSTABLE ELECTRONIC CONTROL SYSTEM

(71) Applicants: Mitchell J. Bogart, New Haven, CT (US); Eliyahu Bogart, New Haven, CT (US); Asher Baum, Brooklyn, NY (US)

(72) Inventors: Mitchell J. Bogart, New Haven, CT (US); Eliyahu Bogart, New Haven, CT (US); Asher Baum, Brooklyn, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/600,508

(22) Filed: Oct. 13, 2019

(65) Prior Publication Data

US 2020/0112171 A1 Apr. 9, 2020

Related U.S. Application Data

(63) Continuation-in-part of application No. 15/866,244, filed on Jan. 9, 2018, now Pat. No. 10,448,477.

(Continued)

(51) Int. Cl.
| | |
|---|---|
| *G05F 1/66* | (2006.01) |
| *G05F 1/10* | (2006.01) |
| *F21V 23/04* | (2006.01) |
| *H05B 45/10* | (2020.01) |
| *G05F 1/625* | (2006.01) |
| *H03K 17/94* | (2006.01) |

(Continued)

(52) U.S. Cl.
CPC ............... *G05F 1/66* (2013.01); *F21V 23/04* (2013.01); *F21V 23/0435* (2013.01); *G05F 1/10* (2013.01);

(Continued)

(58) Field of Classification Search
CPC ............ H05B 33/0852; H05B 33/0845; H05B 33/0863; H05B 45/10; F21K 9/232; G05F 1/10; G05F 1/625; G05F 1/66; Y02B 20/346; Y02B 20/343; F21V 23/04; F21V 23/0435; H03K 17/94; G06F 3/02

(Continued)

(56) References Cited

U.S. PATENT DOCUMENTS 8,686,663 B2 * 4/2014 Ishikita .................. H05B 47/19
 315/296
9,363,871 B2 * 6/2016 Williams ................ H02J 9/005

(Continued)

*Primary Examiner* — Ali Alavi
(74) *Attorney, Agent, or Firm* — Israel Nissenbaum; Yitzy Nissenbaum

(57) ABSTRACT

An electrical device with a power switch has at least two different electrical operational states and a circuit which detects a sequence of momentary fluctuations of power defining a First user message, corresponding to a change in state. The circuit implements that change in state in response to detection of the First message. Another circuit detects a sequence of momentary fluctuations of power, different from the sequence of the First user message, defining a Second user message and defining a fixed Reset electrical operational state. The device also implements a change from the current electrical operational state, to the fixed Reset electrical operational state. A memory circuit stores the current electrical operational state, a number corresponding to one of the countable numbers of electrical operational state, and provides retentions of its memory, including the stored current electrical operational state, during periods of power off.

17 Claims, 9 Drawing Sheets

Related U.S. Application Data

Figure 1:
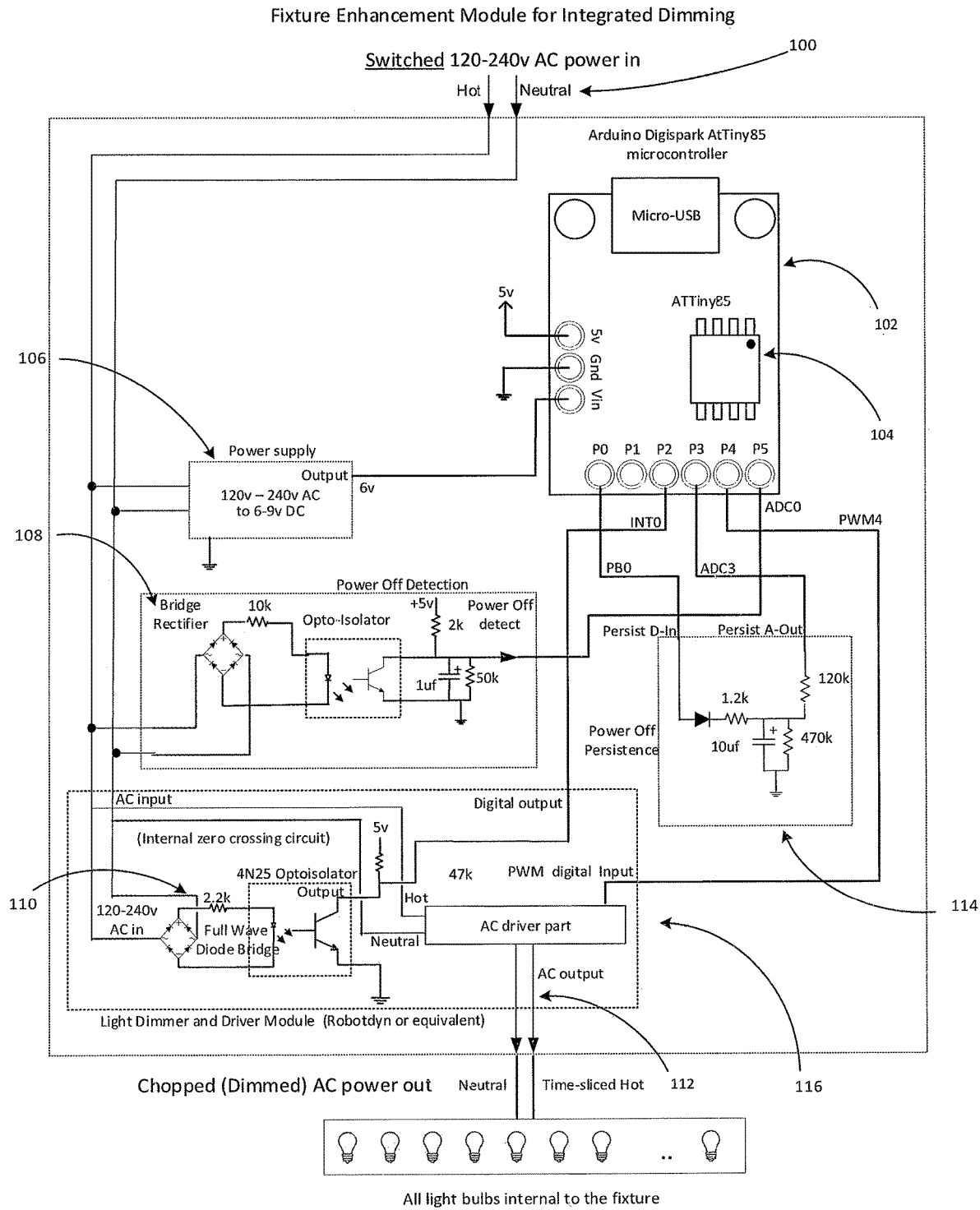

(60) Provisional application No. 62/909,116, filed on Jan. 23, 2017.

(51) Int. Cl.
*G06F 3/01* (2006.01)
*G06F 3/02* (2006.01)

(52) U.S. Cl.
CPC ............. *G05F 1/625* (2013.01); *H03K 17/94* (2013.01); *H05B 45/10* (2020.01); *G06F 3/011* (2013.01); *G06F 3/02* (2013.01)

(58) Field of Classification Search
USPC .......................................................... 362/257
See application file for complete search history.

(56) References Cited

U.S. PATENT DOCUMENTS

| | | | |
|---|---|---|---|
| 9,801,250 B1* | 10/2017 | Halliwell | F21K 9/238 |
| 9,823,747 B2* | 11/2017 | Underkoffler | G06F 3/017 |
| 2006/0267676 A1* | 11/2006 | Mizuno | G11C 5/147 |
| | | | 327/546 |
| 2010/0231135 A1* | 9/2010 | Hum | H05B 45/48 |
| | | | 315/250 |
| 2011/0291585 A1* | 12/2011 | Foo | H05B 47/10 |
| | | | 315/291 |
| 2012/0133342 A1* | 5/2012 | Murata | F03D 9/255 |
| | | | 322/21 |
| 2017/0146730 A1* | 5/2017 | O'Keeffe | G02B 6/0095 |

* cited by examiner

Automated Replacement Switch for lighting systems with switch-control of the patent

ADJUSTABLE ELECTRONIC CONTROL SYSTEM

This application is a continuation-in-part of U.S. Ser. No. 15/866,244, filed Jan. 9, 2018, which takes priority from U.S. provisional patent application No. 62/909,116 filed Jan. 23, 2017, the disclosures of which are entirely included herein by reference thereto.

FIELD OF THE INVENTION

This invention relates to controls for electrical devices such as ceiling fans (with or without contained lights), light fixtures and modules and light switches.

BACKGROUND OF THE INVENTION

The invention disclosed in the parent of this application relates to an upgraded form of light control for the configurations of one or more light bulbs, alone or in a fixture, lamp, wall or ceiling, with power controlled by one or more switches.

A problem which the invention of the parent application addressed is a common consumer desire to change the emission of light in one way or another. However, the existing ways of accomplishing this each have significant limitations. For example, to change brightness, either a 3-way bulb or a light dimmer may be used. The 3-way bulb approach requires a special fixture with a 3-way light bulb socket. Adjustment of 3-way bulbs is only possible via the physical switch at the lamp socket, thus providing only a single local point of activation rather than by remote control. Electronic dimmers are widely available and provide a remote point of control. These dimmers however represent an additional purchase and require installation which many consumers are not capable of or are not comfortable with, and which must be done properly for reasons of both safety and proper operation.

Another desirable change is to alter the color temperature of the light. Currently this is generally done by replacing the light bulb with a different one, either Warm white or Cool white, according to the consumer's preference. Specialty adjustable color temperature bulbs are becoming more available and generally offer fully adjustable color and lower power output for the bulb size. They almost all use a hand-held RF (radio frequency) remote control or control via an App (application program) on a smart phone, though for some it is possible to install a special hard-wired control. These remote controls and Apps require a tech savvy consumer to setup and link the operation of multiple bulbs together, as each has its own radio channel or code. Additionally, Apps on smart phones require two hands, an inconvenience compared to a traditional switch when one is carrying something or some one.

An additional limitation is that there are now at least two places to control the light, the existing light switch and the new remote, which the user must furthermore take care not to misplace. Use of hard-wired light dimmers presents an additional limitation when it is desired to control very large numbers of light bulbs in unison. A large living room, recreation room, conference room, or auditorium may require many bulbs, perhaps as many as 10 to 100 or more for some institutions. A light dimmer has limited capacity, typically 300 watts and usually 500 watts at most. Even for very efficient light bulbs this capacity would easily be exceeded. Furthermore, such dimmers provide dimming control at one switch location only. Other switch locations, connected by using 3-way or 4-way wiring for those same lights, will not provide any dimming control. New types of digital Wifi solutions are also available, such as Insteon or GE Wink hubs. These do provide, multiple location control and dimming—if one uses a smart phone or other additional devices. However, those systems are also definitely not for the high tech averse, of whom there are many. They are even not the choice of many gadget-loving people who simply desire regular, old-fashioned, reliable light switch control. It was the purpose of the parent application invention to provide a solution in the form of a replacement light bulb or fixture having incorporated therein all the features of dimming, color temperature change, and which are useful with very large numbered bulb installations, with virtually none of the above limitations.

The above problems, encountered with light bulbs, also extend to other electrical devices having similar control issues, but which are not light bulbs. These devices include ceiling fans with High-Medium-Low, fan speed controls which may be coupled to controls of lighting Light-Fan fixtures. Modules with multiple light bulbs and multiple modules are also similarly beset with control problems, as outlined above with respect to the single bulbs of the parent application. Furthermore, light switches have not been made with enhanced controls other than ON/OFF and dimming controls with specific bulbs.

SUMMARY OF THE INVENTION

It is thus a given that the typical consumer is comfortable with changing the light bulb, but not the switch. A light bulb of the parent application invention contains all the innovation required to overcome the aforementioned drawbacks. It neither requires a 3-way socket nor a special fixture. All control is performed by simply using the existing switch.

It is therefore an object of the invention to extend the use and application of the bulb configuration of the parent application, to other electrical devices having multiple control settings and which require either control units separate from the device power switch or which require retrofitting or additional control installations. Examples of such electrical devices including fans having Hi-Medium-Low settings, modules with multiple light bulbs and multiple modules and typical ON/OFF light switches.

Controls for the electrical devices of this invention are configured to provide the same advantage of the light bulbs of parent application wherein a regular 2-terminal bulb, may be installed in either a 2-way or 3-way socket without compromising any functionality. The electrical devices herein similarly are regular or unmodified devices with respect to normal utilization but with enhanced function control with existing controls.

As with the light bulbs of the parent application, full control of the electrical device is provided at all of the two, three, or more switch locations for a given circuit, as long as those switches are able to turn power Off and On, which, of course, is their primary and only function, without changes of electrical wiring or the need for additional control installation. The same existing switches and wiring are used.

Still another advantage of the invention is that electrical device function, other than ON/OFF, and other adjustments are enabled for rooms with an extremely large number of such devices such as large rooms with multiple ceiling fans. For new installations, where high efficient electrical devices are used they may be variably controlled on a single circuit.

As with the light bulbs of the parent application, the electrical devices are directly and integrally provided with control circuitry which enables device function to be controlled by specific manipulation of the existing control switches such as ON/OFF switches.

This is analogous to dimming of light bulbs, accomplished within the bulb of the parent application, without a central dimmer that must handle the aggregate heat dissipation. Other device functions are further analogous to variable color temperature control. These advantages are all enabled by something called "continuous wave modulation." Continuous wave modulation, or "CW" as it is abbreviated, means sending a signal by multiple turnings of something On and Off, similar to how radio operators send messages using Morse code. The messages of this invention and that of the parent application are sent by a momentary toggle of a switch to off, once power has already been applied, or a momentary toggle of a switch to On, once power has already been removed. One of the main advantages of CW is its extreme simplicity. No special modulators or transmitters are needed. Everything is accomplished with simple On/Off transitions. This invention uses the switches of an existing circuit to send very brief "power line messages" as the described On or Off signals to the electrical devices of the invention installed in that circuit.

Many possible embodiments of the invention in the parent application were cited as being possible including, but not limited to:
(1) A multiple color temperature light bulb containing both Warm White and Cool White light emitting elements wherein a click of the switch sequences among energized states of just Warm, just Cool, and Both types of light-emitting elements.
(2) A multiple brightness light bulb wherein a click of the switch sequences among energized states of different brightness where the dimming is accomplished with PWM (Pulse Width Modulation) generated internally in the bulb.
(3) A multiple brightness light bulb containing multiple internal light-emitting elements, such as many LED bulbs have, wherein a click of the switch will sequence among brightness states by energizing various numbers of its multiple internal light-emitting elements between all and one.
(4) A bulb with both adjustable brightness and adjustable color temperature, both of which are controlled and adjusted from multiple locations via switch flicks.
(5) A multiple function bulb incorporating a general purpose micro-controller to implement the methods of the invention for flexibility of design and cost saving.

The parent application was specifically directed to control of bulbs and bulb fixtures which detect and respond to fluctuations of power from existing switches to control the lighting state (brightness and/or color temperature) and stored memory of those states. The present application extends the teachings of the parent application to further include the control of ceiling fans, having analogous High-Medium-Low fan speed control. Though a fan motor is neither a bulb nor a bulb fixture, fan speed is operationally analogous to Brightness and the control thereof in light bulbs.

Another embodiment of the present invention is that of multiple light modules. A reasonable dimming enhancement for fixtures with many bulbs is to add a single module which responds to power switch fluctuations and dims all its standard bulbs, rather than requiring replacement of all of them with bulbs of the invention. This module is not a bulb, light emitting device, or fixture and is included herein as an enhancement in utilizing multiple common bulbs without separate circuitry. This device enhancement can be installed in multiple places, such as inside or outside the fixture, or inside or outside the light switch housing.

A further embodiment herein is that of a replacement light switch specially made for use with power fluctuation bulbs fixtures, and fans of the invention. This electronic switch can add scheduling of stored changes (so the stared memory state of devices (even when off) gets set to Cool before any daytime use, and set to Warm before and evening and night use. It can also simplify use by replacing multiple manual power togglings with single button composite. (A, for example a single button press to "Set all fan-lights to LowSpeedwithLightOff". It is the matching "transmitter" to the invention's power fluctuation "receiver".

The above and other objects, features and advantages of the invention will become more evident from the following discussion and drawings in which.

SHORT DESCRIPTION OF THE DRAWINGS

FIG. 1—A schematic diagram of an Arduino microcontroller implementation of an Enhancement Module (board) providing Integrated Dimming and/or other control to all lighting fixtures or motors connected to the module.

Figure 2:
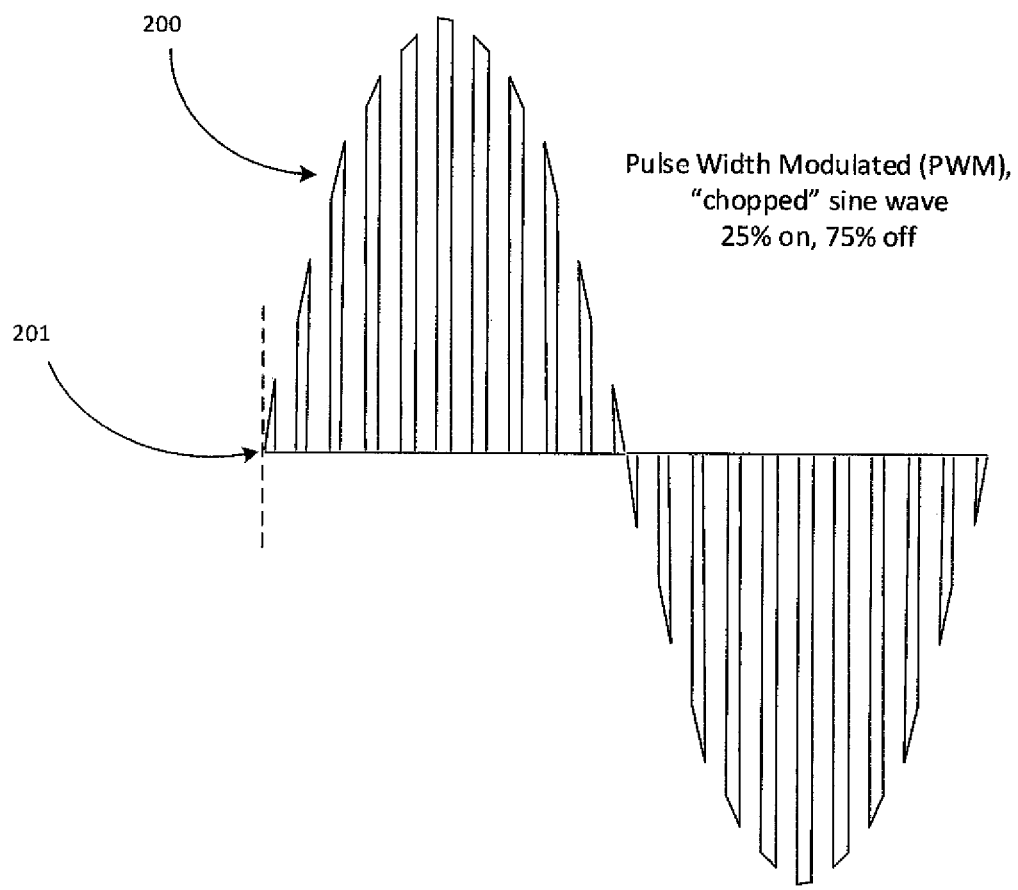

FIG. 2—A representation of one AC sine wave cycle of AC power with power reduced to 25% by using 25% duty cycle pulses of Pulse Width Modulation (PWM).

Figure 3:
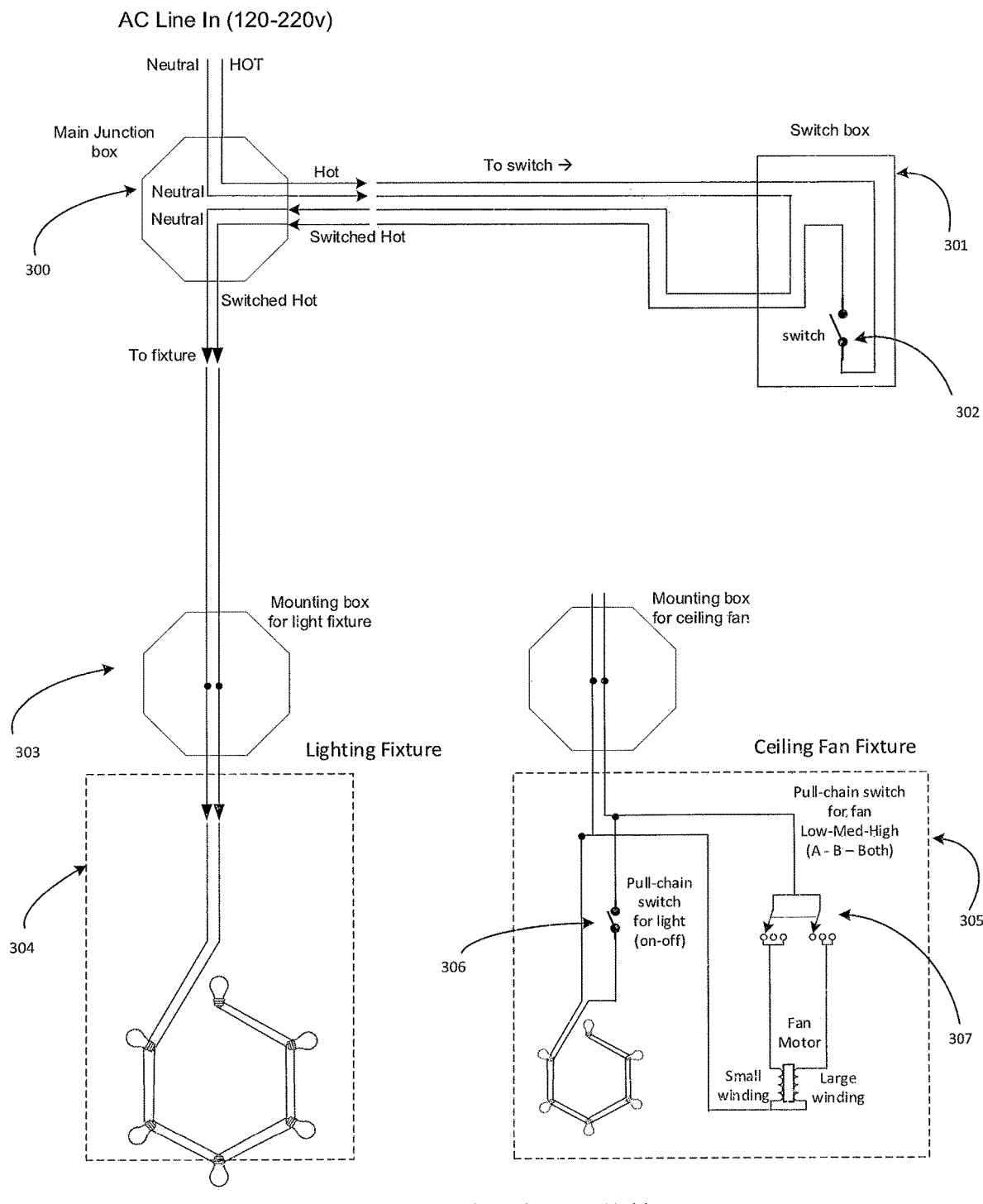

FIG. 3—(prior art)—A wiring diagram showing the interconnections of a fixture, a switch controlling that fixture, a mounting junction box at the fixture, and a main interconnection junction box for the circuit, bringing together wire cables from the AC power, the fixture box, and the switch box into the junction box.

Figure 4:
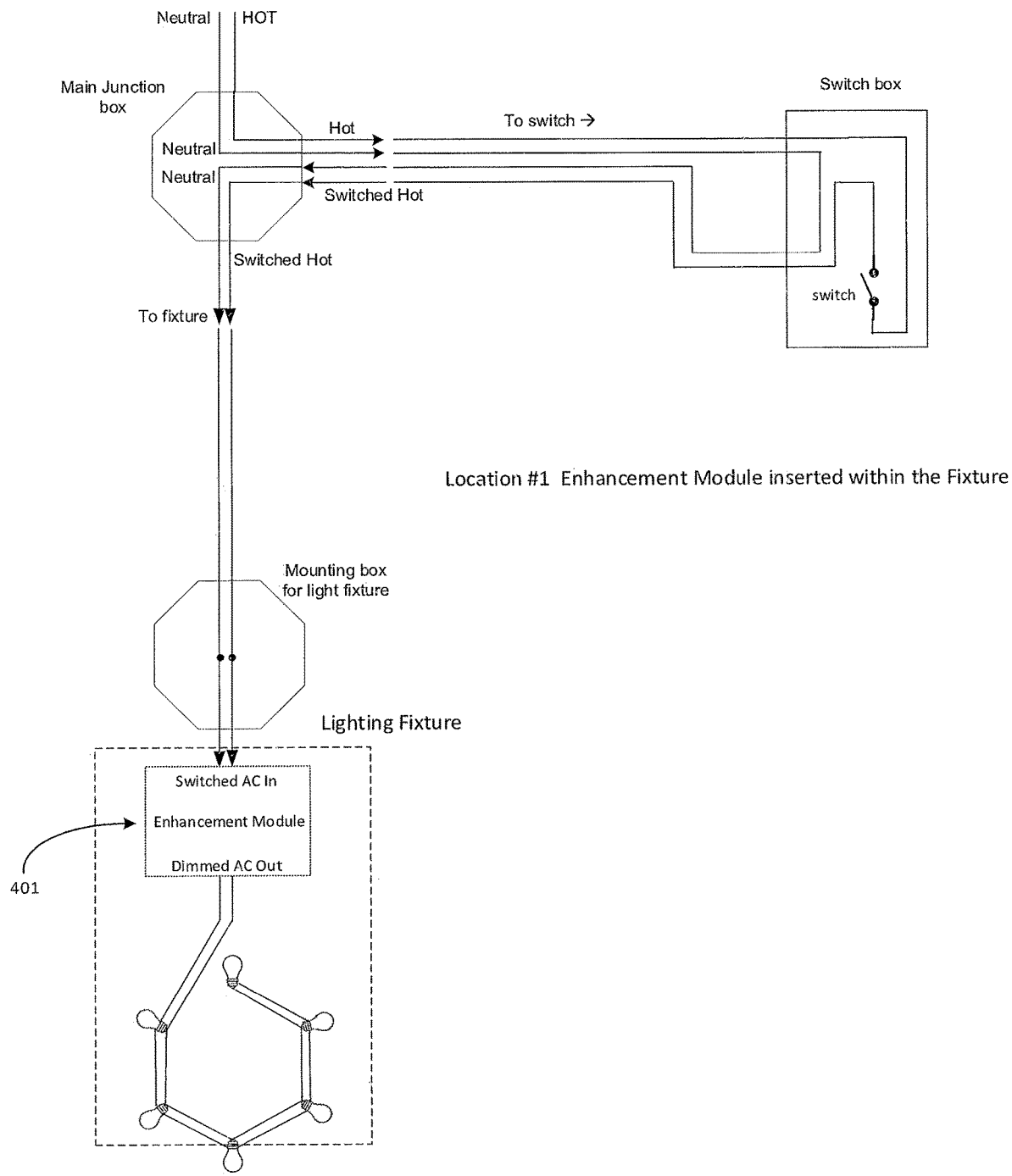

FIG. 4—The wiring diagram of FIG. 3. with the addition of wiring in the Enhancement Module, physically locating the module inside the Fixture [by the manufacturer].

Figure 5:
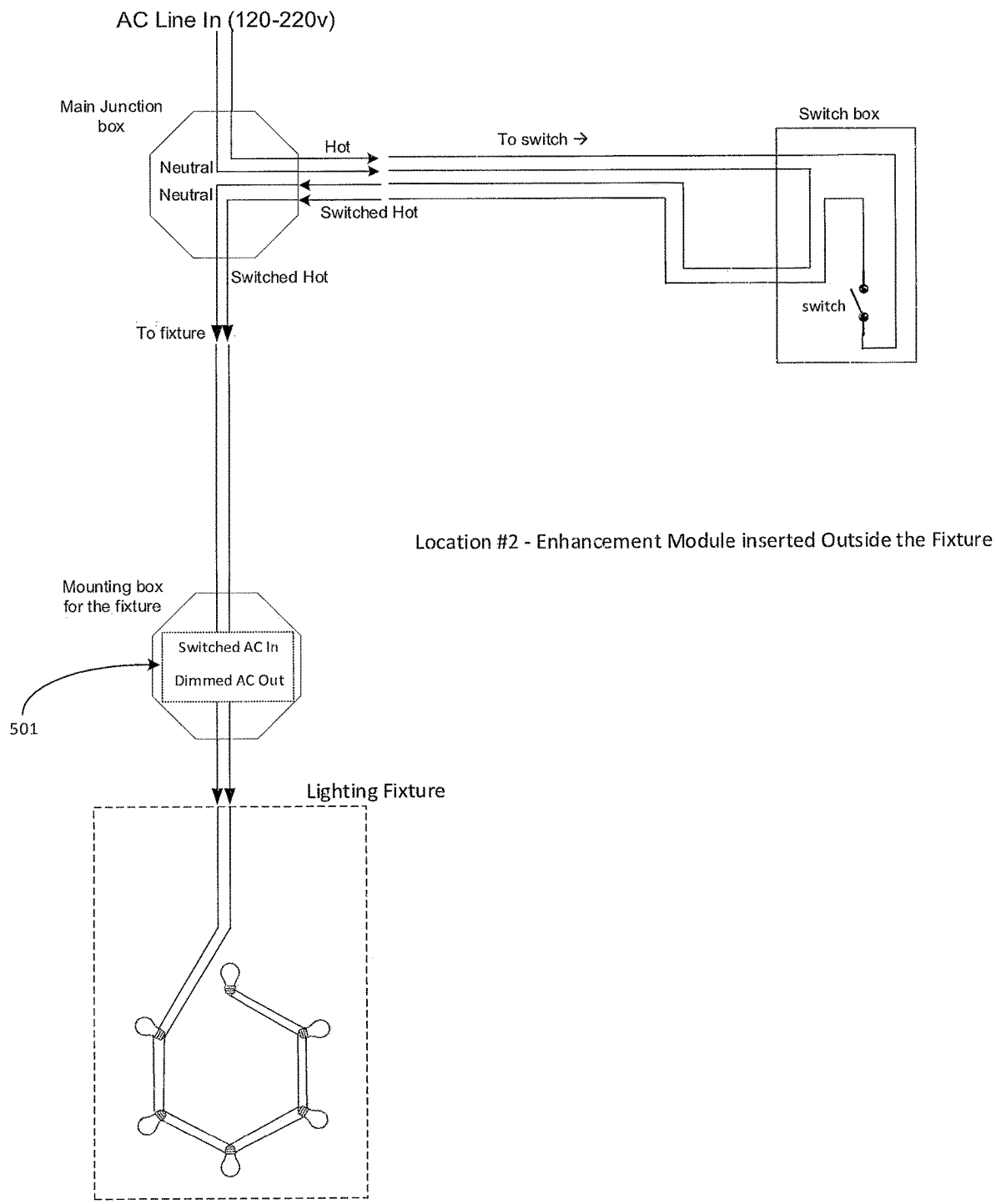

FIG. 5—The wiring diagram of FIG. 3. with the addition of wiring in the Enhancement Module, physically locating the module externally to the fixture and internally to the fixture's mounting junction box.

Figure 6:
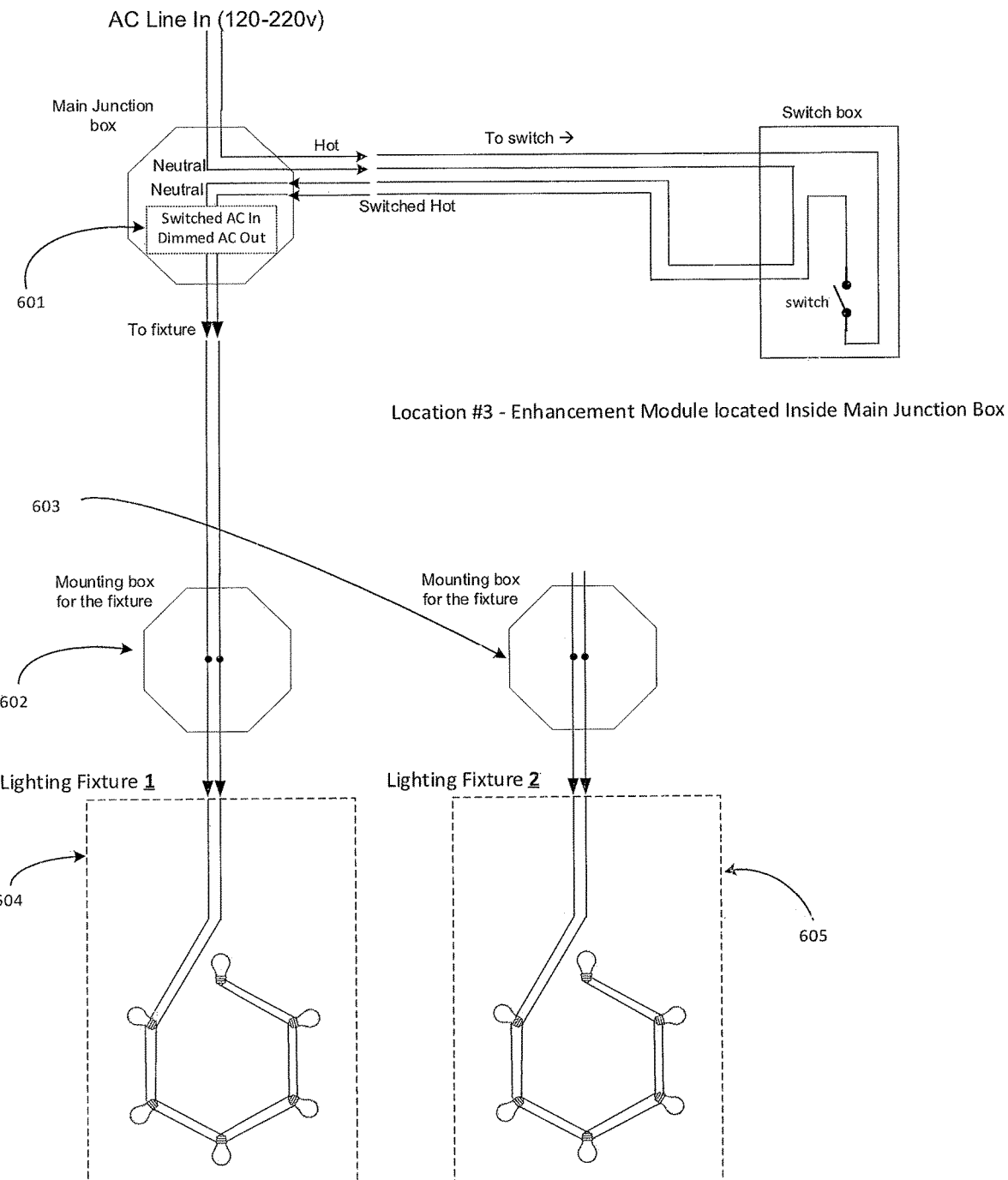

FIG. 6.—The wiring diagram of FIG. 3. with the addition of wiring in the Enhancement Module, physically locating the module inside the main interconnection junction box.

Figure 7:
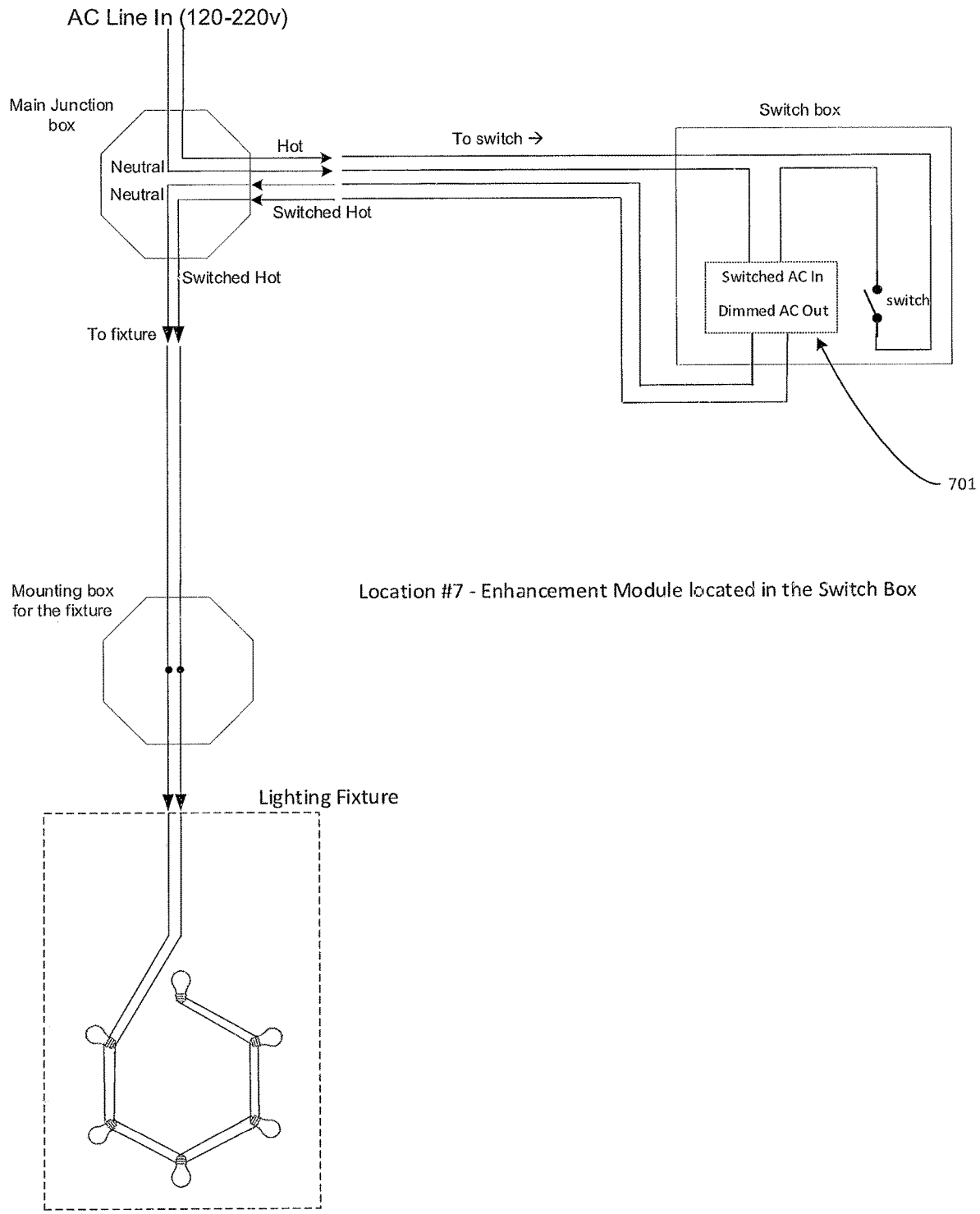

FIG. 7—The wiring diagram of FIG. 3. with the addition of wiring in the Enhancement Module, physically locating the module inside the switch electrical box.

Figure 8:
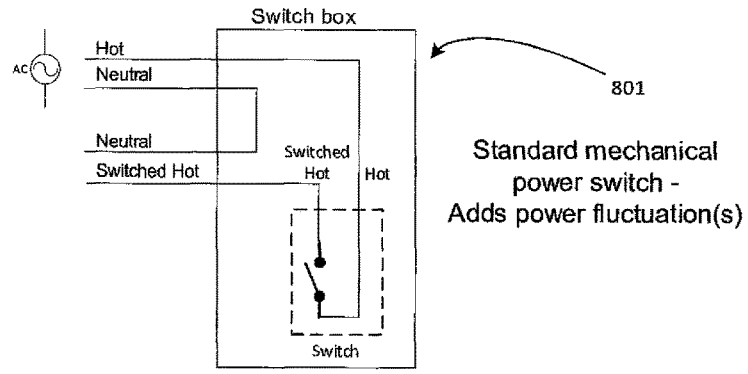
Figure 8:
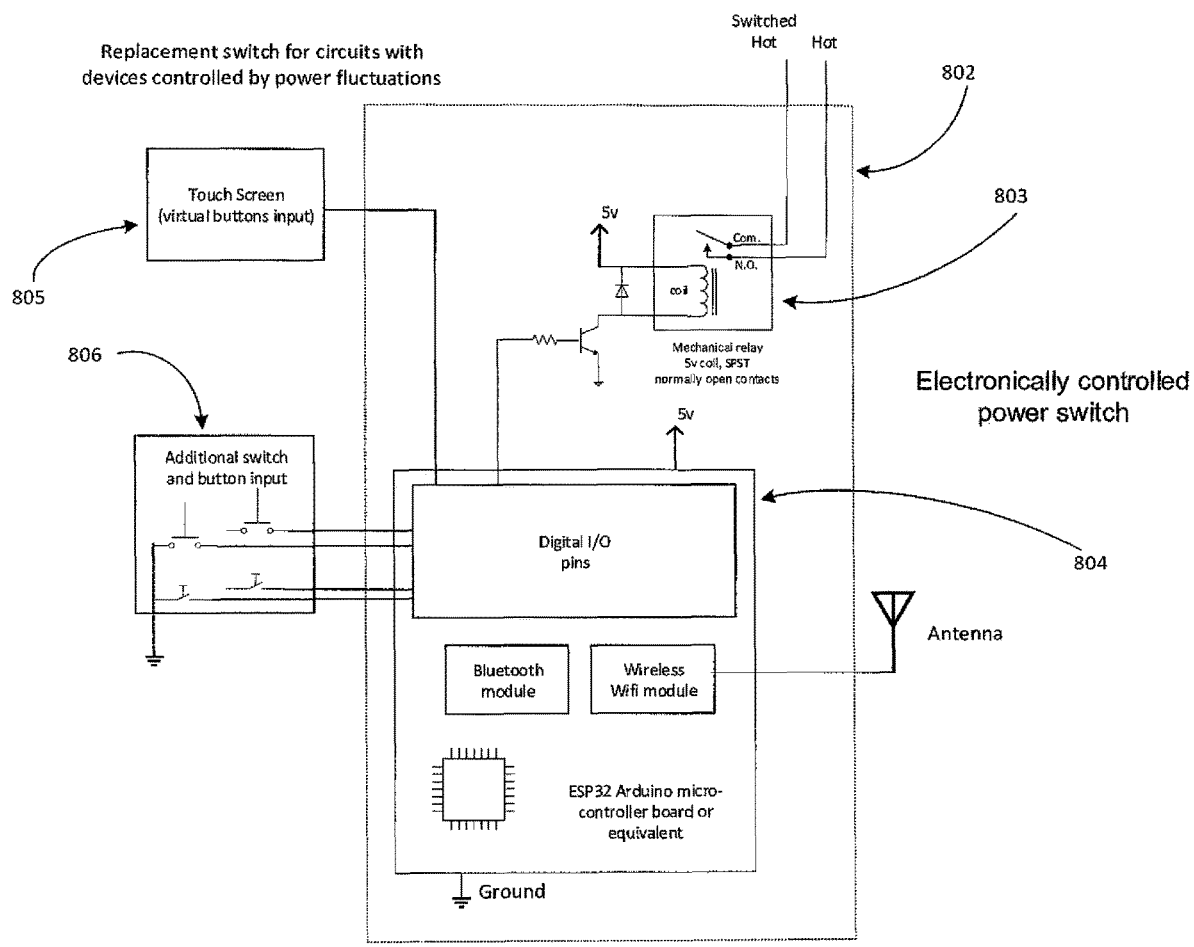

FIG. 8—A block diagram, with schematic elements, of an Electronic replacement switch for lighting [and other] systems using standard devices [such as motors and/or dim-able light bulbs (Including Incandescent, Compact Fluorescent, and LED bulbs)].

Figure 9B:
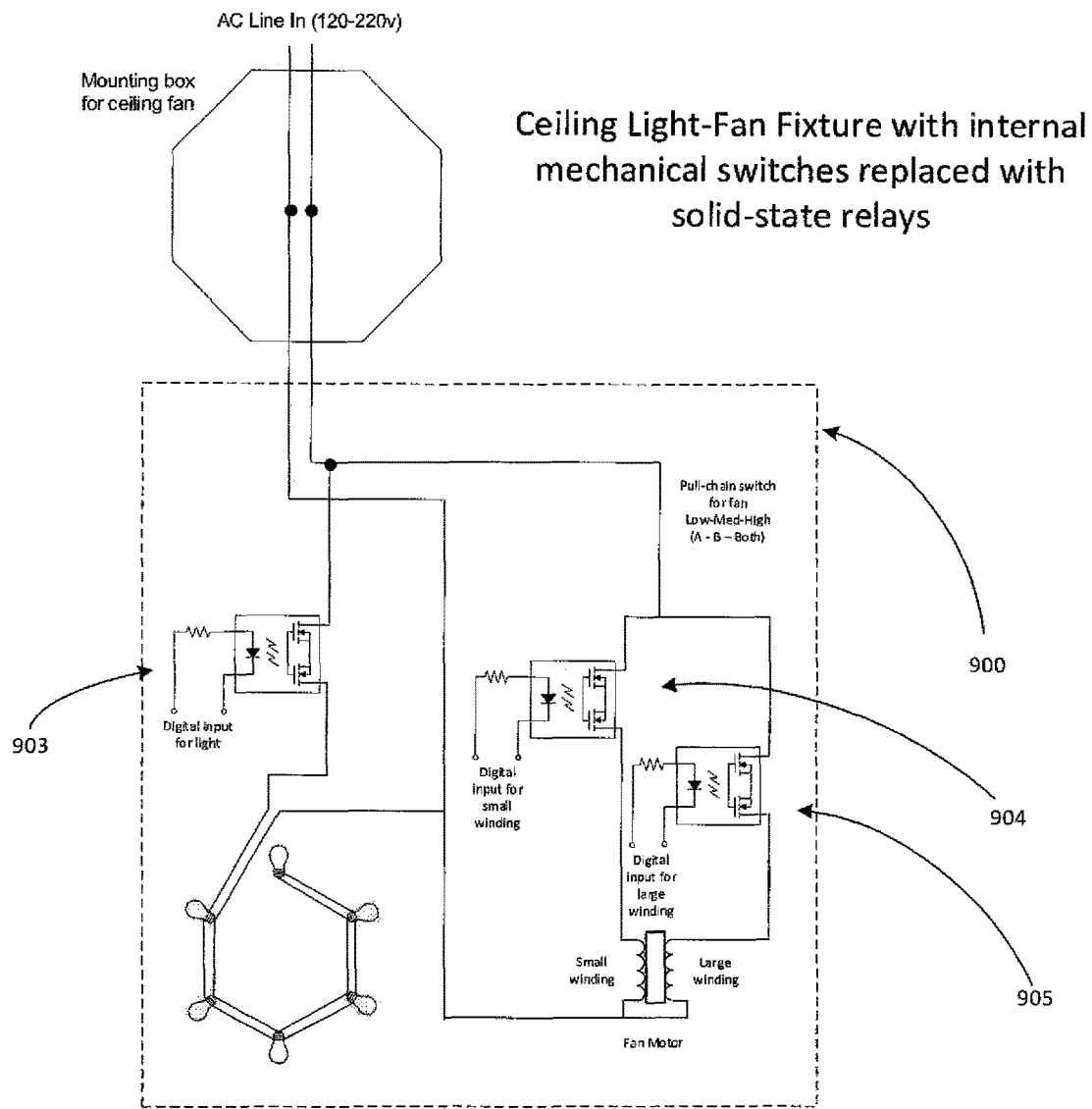
Figure 9A:
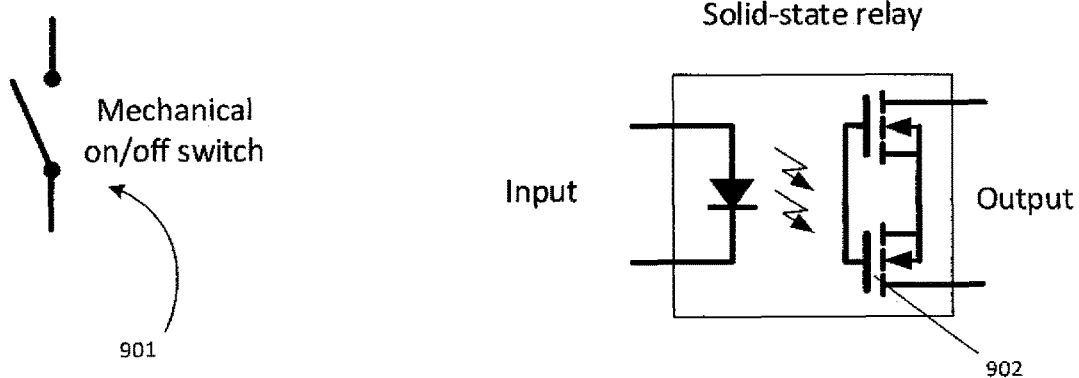

FIG. 9A—The symbol for a mechanical switch (prior art) and the symbol for an electronic solid-state relay (prior art).

FIG. 9B—A wiring diagram showing a ceiling Light-Fan fixture, with On-Off light states and Low-Medium-High fan speed control, with the internal mechanical switches replaced by electronic, solid-state equivalent switches, enabling switch control of both light and fan at any and all wall switches via the control mechanisms of the invention.

DETAILED DESCRIPTION

Referring to FIG. 1, an enhancement for a lighting fixture is shown. Other devices, such as electric motors, which also operate well on pulsed power, may also be used. Motor speeds are controlled well with PWM (Pulse Width Modulation). AC line power 100 enters the module at the top. Hot and Neutral wires are shown. Power is referred to as "switched" as at this point this power fluctuates On/Off according to positions of one or more external switches. Functionally, the enhancement module is placed in the circuit between the power coming from the switch and output device or load. Accordingly, the module may be physically placed inside any electrical box electrically in between, as will be shown.

Micro-controller 102 is shown as a sub-module inside the enhancement module. Central to the sub-module, at its core, is the micro-controller chip 104. DC power to run the controller chip is provided from AC input power by power supply 106. Power Off detection circuit 108 is shown also connected to AC input power. AC power is rectified by a bridge diode rectifier configuration producing pulsed DC connected through a voltage dropping resistor to turn the internal LED of an opto-isolator on and off, depending on the presence or not of AC power. While power is on, the LED is on, which then energizes the phototransistor part of the opto-isolator as shown, causing it to conduct and keep the voltage across the output capacitor at 0 volts. The capacitor serves to smooth out the DC pulses. When the power is switched off, the LED turns off, the phototransistor stops conducting, and the voltage across the capacitor quickly rises to 5 volts, a representation of a digital High level which is connected through a forward flowing diode to input pin ADC0 (A/D Converter input #0) on the micro-controller board. The diode prohibits charge from the micro-controller from keeping the capacitor charge high immediately after power goes off. Detection of the presence of AC input power is enabled under software program control by reading the level of the ADC0 using either a Digital Read or an Analog Read command.

Referring further to FIG. 1, Power Off Persistence circuit 114 is shown. When the control program is up and running, a High digital level is output on the controller's PB0 pin. This signal, labeled Persist-D (Digital) is passed through a diode to quickly charge the 10 uf capacitor to High through the 1.2 k ohm series resistor. The controller can read the voltage on the capacitor, via an Analog Read, on its pin ADC3. As described also in the parent application, which also uses this circuit, when AC power disappears, the voltage on the 10 uf capacitor slowly discharges through the 470 k ohm resistor. The time constant is relatively long, lasting roughly 3 seconds for the voltage to fall below the 10% level. This enables the control program to determine, immediately after power is turned on, whether the duration of the previous off period was relatively short or long.

Referring further to, FIG. 1, the remaining AC drive circuits 116 and Zero Crossing detector 110 are shown, both of which are also connected to the switched AC input power. They work in a coordinated manner and may be located on physically separate PC boards or sections of one PC board, or as shown in the example embodiment, as two parts of an external module sold as one, an example being the Robotdyn Dimmer and Driver module. Regardless of the physical locations of components, they function to produce Chopped (dimmed) AC power output, one sine wave cycle of which is shown in FIG. 2. The positive excursion of AC voltage, the upper half, is shown as portion 200. It is preferable to synchronize the pulse width modulation with the AC power cycles. The Zero Crossing detector circuit provides an output pulse to the micro-controller whenever the AC voltage crosses 0, indicated by zero voltage line 201, that is when going from negative to positive voltage and vice-versa. This signal is sent to the micro-controller as an interrupt (INT0) input so that it gets processed as quickly as possible. The micro-controller then outputs standard, repeating, Pulse Width Modulated pulses via its PWM output, here labeled on FIG. 1 as PWM4, synchronized to the AC zero crossings. The PWM signals are sent as an input to the AC Drive circuits 116, which effectively uses the pulses to chop the AC power signal according to the PWM input. The result is shown in FIG. 2, which shows pulses of approximately 25% duty cycle. The micro-controller can vary the width of the pulses, its duty cycle, from 0% to 100%, depending on what is called for by the user inputs and program. As shown at the bottom of FIG. 1, this chopped AC power output from the enhancement module gets connected to all bulbs on the circuit, for example all the bulbs in one or more lighting fixtures or chandeliers, providing multiple light levels. For control of DC motors, the DC PWM pulses directly feed high current driver transistors, Darlingtons, of FETs, to provide multiple motor speeds, additionally providing higher torque at low speeds. The drive circuitry for many AC motors presents an additional specific case. These AC motors frequently comprise multiple windings, a common example being ceiling fans, which commonly have two windings, a small and a large. A 3-position switch, usually a pull-chain type, energizes the small, or the large, or both windings to provide Low, Medium, and High ceiling fan speeds. The driver circuitry to replace the switch can include mechanical and solid-state relays relays or some high voltage high current solid state devices. A popular solid-state relay example is the Omron G3 MB-202P. Regardless of the specific output drive circuitry used, use of the power fluctuation messages of the patent provides a very unique and simpler robust control of light brightness, motor speed, or other appropriate parameter, for multiple devices on the circuit. There is simultaneous control at each and every switch location of the circuit, including the essential synchronizing Reset simultaneously for all devices on the circuit.

As mentioned previously, the fixture enhancement module may be physically placed anywhere along the control circuit where it has access to the both the switched-controlled AC power, as well as connections to the fixtures or devices for combinations of loads that are capable of using chopped AC power.

Referring to FIG. 3, as prior art, a typical AC switched power circuit including switch and load is shown, labeling four example locations of where the enhancement module might be installed. Shown locations are inside of: the Main Junction Box 300, the Switch Box 301 with internal switch 302, the above-fixture Mounting Box 303, and the load, illustrated here as a six bulb light fixture 304.

Referring to FIG. 4, the enhancement module 401 is shown connected and placed inside the lighting fixture 304 of FIG. 3.

Referring to FIG. 5, the enhancement module 501 is shown connected and placed inside the above-fixture Mounting box 303 of FIG. 3.

Referring to FIG. 6, the enhancement module 601 is shown connected and placed inside the Main Junction box 300 of FIG. 3.

Referring to FIG. 7, the enhancement module 701 is shown connected and placed inside the Switch box 301 of FIG. 3.

Referring to FIG. 8, a standard switch box 801 with internal mechanical switch is shown at the top. Box 802 shows an electronic replacement for the standard switch, producing multiple power fluctuations automatically in response to user input. Micro-controller 804 is shown having both Bluetooth and Wifi wireless connection internal circuitry. Touch screen display 805 is shown connected schematically, with one line, to the micro-controller. Additional switches and buttons are also shown as user input box 806. With commonly available internal or external calendar clock circuits, and/or light sensitive dawn/dusk sensors, the replacement switch can automatically and appropriately control connected loads to varying degrees of brightness or speed according to schedule or dawn/dusk recognition. Relay 803 is shown connected and controlled by an output pin of the micro-controller. The Normally open and Common relay contacts take the place of the two switch connections and function similarly to produce On/Off power fluctuations. Solid-state relays or similar devices may be used, which would provide more silent, as well as perhaps faster and/or more complex operations.

Referring to FIG. 9A, mechanical switch 901 is shown as used for existing light and fan control of typical ceiling light with fan fixtures. Reference number 902 shows a solid-state relay intended for use as an electronic replacement for mechanical switches. When the digital logic level input is at logical High level, the output connections conduct at very low resistance, similar to a wire.

Referring to FIG. 9B, a wiring diagram is shown for a ceiling Light-Fan fixture 900 with its internal mechanical switches replaced by solid-state equivalents, enabling switch control via the fixture enhancement board of the invention.

The six lamps of the fixture are controlled on/off vial the solid-state relay 903. The digital input is suitable to be directly connected to a digital output of the enhancement boards micro-controller. The replacement for the 3-position fan switch uses solid-state relays 904 and 905 to control the small and large motor windings, respectively.

With these switch replacements used together with the fixture enhancement board, perhaps customized to include the switch replacement on the board, a plurality of ceiling Light-Fans may be fully controlled simultaneously via any and all existing light switches. This is simply not possible with any and all existing methods of ceiling Light-Fan control available today, which require special remotes, smart-phones, Bluetooth devices or expensive in-wall replacement switches. The 2009 article from TheSmartCave.com, entitled "Say Goodbye To Pull-Chains: 7 Ways To Add Smart Control To Your Old Ceiling Fan" is cited as evidence of the state of the art at this time.

Various advantages of installing an enhancement board of the invention within a fixture include:
1) All state changes of all LEDs and bulbs will always be in unison. (No clashing of bright and dim bulbs).
2) Modules can be easily retro-fitted to existing fixture products, adding significant value, perhaps to become a "must-have" feature for all fixture manufacturers.
3) Many manufacturers are currently adding "Integrated LED" fixtures as fast as they can. This feature (especially with di al sets of LEDs, for variable color temperature) provides an additional real, utility-based reason for customers to upgrade to Integrated LEDs. Why be wrong half the time with Warm vs Daylight decision? Get a fixture with both.
4) Banquet halls or other rooms with multiple fixtures now have an extremely economical way to add Brightness control to all. (One monster conventional dimmer is not a great solution)
5) People in rooms with 3-way (2 switch locations) or 4-way (3 switch locations) can fully control the room from all switch locations.

Additional (to above) advantages of installing the enhancement board just outside the Fixture include:
1) Once an enhancement board is installed inside the fixture mounting box, all future installed standard fixtures and bulbs will have switch-controlled Brightness from all the connected switches.
2) Enhancement modules thus have the potential to be a "must-have" feature in most electricians' tool boxes, similar to installing a single light dimmer switch, but enabling several fixtures and having control at multiple switches.

Other Additional advantage to installing the enhancement board in main junction boxes include:
1) As LED bulbs continue to proliferate, this approach is the most economical, as one Module can cover many fixtures. Circuits and devices can handle five times as many LED bulbs as incandescent (and twice as many as CFLs). One 2000 watt dimmer module might easily handle 100 13 w-18 w (60 w to 90 w equivalent) LED bulbs. That would cover 10 fixtures with 10 bulbs in each, or 33 3-bulb fixtures.

Further Additional advantages to installing the enhancement board inside the switch box[es] include:
1) This is perhaps the fastest upgrade. Ladders are not needed. The level of work is similar to installing a single light dimmer switch.
2) Switches are already grouped to handle multiple fixtures. Compared to using one enhancement board per fixture, using one board per switch box is fewer and thus more economical. For existing large institution rooms having banks of light switches, this is an excellent choice.

It is understood that the above description and drawings are illustrative of the invention and that changes may be made to circuitry and applications as well as to controlled devices without departing from the scope of the invention as defined in the following claims.

What is claimed is:

1. An electrical device connected to electric power controlled by a switch, the electrical device having at least two different electrical operational states and further comprising:
 a) a circuit configured to detect a sequence of one or more momentary fluctuations of power defining a First user message, said First message corresponding to a change in electrical operational state, said circuit further configured to implement that change in electrical operational state in response to detection of the First message; and
 b) a circuit configured to detect a sequence of one or more momentary fluctuations of power, different from the sequence of the First user message, defining a Second user message, said second user message corresponding to and defining a fixed Reset electrical operational state, and further configured to implement a change from the current electrical operational state, regardless of which electrical operational state that may be, to the fixed Reset electrical operational state; and
 c) a memory circuit which is volatile or non-volatile and configured to store the current electrical operational state, a number corresponding to one of the countable numbers of electrical operational state, said memory circuit, when non-volatile, providing retentions of its memory, including the stored current electrical operational state, during periods of power off.

2. The electrical device of claim 1 having operational control circuitry comprising two power connections configured for raw AC input and two power connections for electrically operational AC Output, defining an Add-on Module, wherein the Add-on module is used with the electrical device, by connecting the Add-on Module's electrically operational AC Output to the AC power input of the electrical device and connecting the Add-on Modules Raw AC input to the AC line power.

3. The device of claim 2 further comprising a zero crossing detector circuit configured to facilitate synchronization of a Pulse Width Modulation with the start of each AC power cycle or half power cycle.

4. The device of claim 3 wherein the Add-on module is physically located within the interior of the electrical device.

5. The device of claim 3 wherein the Add-on module is physically located outside the electrical device.

6. The device of claim 5 wherein the Add-on module is physically located within an electrical box providing switched power to the electrical device in one of the electrical boxes to which the electrical device is attached or a separate junction box along the circuit.

7. The device of claim 5 wherein the Add-on module is physically located within an electrical box containing a switch on the circuit of the electrical device.

8. The device of claim 1 wherein the electrical device is a ceiling fan, wherein the device is further configured to have the switch contacts that control the fan replaced with one or more electronic replacement switches configured such that the fan speed is controlled by energizing one or more electronic replacement switches, and the electronic operational states comprise states with two or more different fan speeds or fan directions.

9. The device of claim 8 such that the fan motor control comprises two sets of Open/Close switch contacts, configured to energize a small motor winding and a large motor winding, such, that fan speeds of Low, Medium, and High are effected by energizing only the small winding, only the large winding, or both windings, respectively.

10. The device of claim 9 wherein the ceiling fan device further comprises a light, wherein the device is further configured to comprise a circuit to electrically control the light with one or, more electronic replacement switches, or with an electronically controlled electronic dimming circuit, and the electronic operational states further comprise states with two or more different lighting states.

11. An electronic replacement switch comprising:
a) an electronic switch; and
h) two power connections configured for raw AC input and two power connections for electrically operational AC Output, defining an Add-on Module.

12. A replacement switch for a circuit comprising a switch, and further comprising a plurality of electrical devices, the replacement switch comprising two power connections configured for raw AC input and two power connections for electrically operational AC Output, defining an Add-on Module; an electrically-controlled switch; and circuitry configured to provide power fluctuations with the memory circuit and detection circuits of claim 1.

13. A method of controlling a plurality of electrical devices on one or more circuits, each having at least two electrically operational:
1) installing circuitry connected to, each electrical device configured to detect and respond to intentional fluctuations of power as messages,
2) installing manual switches or automatic electrically controlled switches on each circuit;
3) initiating Changes of electrically operation states, via manual or automatic generation of the power fluctuation messages of claim 1.

14. The method of claim 13 wherein the plurality of electronic devices comprises non-light-emitting devices.

15. The device of claim 1, wherein said memory is non-volatile, and wherein retention lasts indefinitely long after power is turned off.

16. The device of claim 1 wherein said memory circuit is volatile memory, wherein retention lasts for only a finite time, after power is turned off.

17. The device of claim 1 wherein the device, is configured to be controlled by power fluctuations and further comprises a wireless remote control unit and receiver, wherein said wireless remote control receiver and power fluctuation controller are configured to work in conjunction with each other to provide dual control from both the wireless remote control unit and the receiver and the power fluctuation controller.

* * * * *